United States Patent
Neff et al.

(10) Patent No.: US 8,202,741 B2
(45) Date of Patent: Jun. 19, 2012

(54) METHOD OF BONDING A SEMICONDUCTOR DEVICE USING A COMPLIANT BONDING STRUCTURE

(75) Inventors: James G. Neff, Felton, CA (US); John E. Epler, San Jose, CA (US); Stefano Schiaffino, Pleasanton, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 258 days.

(21) Appl. No.: 12/397,367

(22) Filed: Mar. 4, 2009

(65) Prior Publication Data

US 2010/0227421 A1    Sep. 9, 2010

(51) Int. Cl.
*H01L 21/00* (2006.01)
(52) U.S. Cl. ............ 438/22; 438/26; 438/108; 438/614; 257/E25.032
(58) Field of Classification Search ............ 438/26, 438/25, 22, 108, 614; 257/E25.032
See application file for complete search history.

(56) References Cited

U.S. PATENT DOCUMENTS

| | | | | |
|---|---|---|---|---|
| 5,829,125 A * | 11/1998 | Fujimoto et al. | ................. | 29/840 |
| 5,904,499 A | 5/1999 | Pace | | |
| 6,410,415 B1 * | 6/2002 | Estes et al. | ................... | 438/612 |
| 6,455,878 B1 * | 9/2002 | Bhat et al. | ........................ | 257/99 |
| 6,460,591 B1 * | 10/2002 | Gotoh et al. | .................. | 156/359 |
| 6,759,668 B2 * | 7/2004 | Matsuo et al. | ................. | 250/551 |
| 7,256,483 B2 | 8/2007 | Epler et al. | | |
| 7,488,621 B2 | 2/2009 | Epler et al. | | |
| 7,642,121 B2 * | 1/2010 | Slater et al. | ...................... | 438/85 |
| 2002/0179921 A1 | 12/2002 | Cohn | | |
| 2005/0023550 A1 * | 2/2005 | Eliashevich et al. | ............ | 257/99 |
| 2005/0253154 A1 * | 11/2005 | Slater et al. | ...................... | 257/79 |
| 2007/0057271 A1 | 3/2007 | Schiaffino et al. | | |
| 2007/0072324 A1 | 3/2007 | Krames et al. | | |
| 2007/0096130 A1 * | 5/2007 | Schiaffino et al. | .............. | 257/98 |
| 2007/0176288 A1 | 8/2007 | Daubenspeck et al. | | |
| 2008/0054290 A1 * | 3/2008 | Shieh et al. | ...................... | 257/99 |
| 2008/0096297 A1 | 4/2008 | Schiaffino et al. | | |

FOREIGN PATENT DOCUMENTS

| | | |
|---|---|---|
| JP | 09064238 | 3/1997 |
| WO | 2006013800 A1 | 2/2006 |

OTHER PUBLICATIONS

By Joachim Kloeser et al.; Entitled: "High-Performance FLICP CHIP Packages With Copper Pillar Bumping" www.globalsmt.net; Global SMT & Packaging; May 2006; pp. 28-31.
International Search Report and Written Opinion, PCT/IB2010/050748, Aug. 27, 2010.

* cited by examiner

*Primary Examiner* — Michael Trinh

(57) ABSTRACT

A compliant bonding structure is disposed between a semiconductor device and a mount. In some embodiments, the device is a light emitting device. When the semiconductor light emitting device is attached to the mount, for example by providing ultrasonic energy to the semiconductor light emitting device, the compliant bonding structure collapses to partially fill a space between the semiconductor light emitting device and the mount. In some embodiments, the compliant bonding structure is plurality of metal bumps that undergo plastic deformation during bonding. In some embodiments, the compliant bonding structure is a porous metal layer.

15 Claims, 3 Drawing Sheets

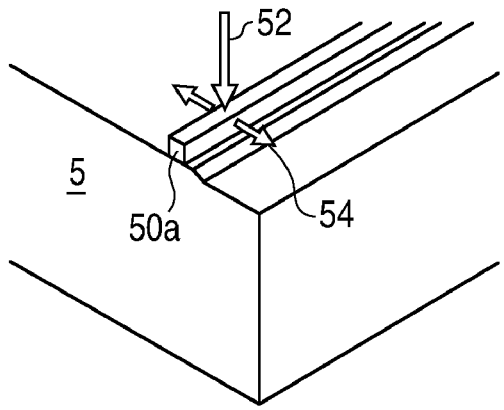 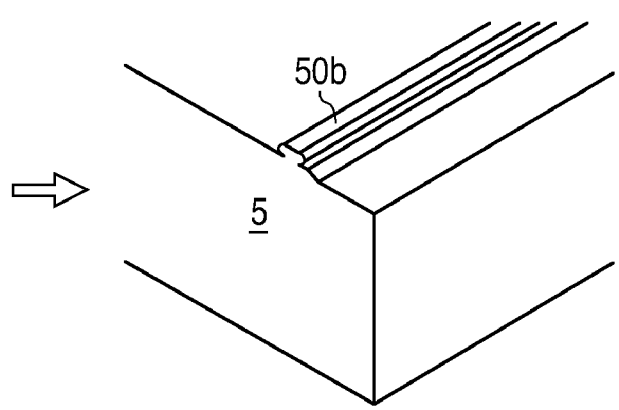
FIG. 8  FIG. 9
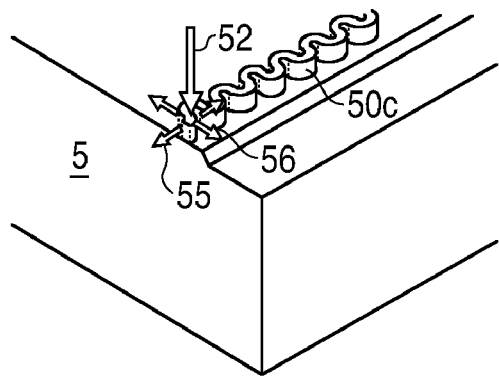 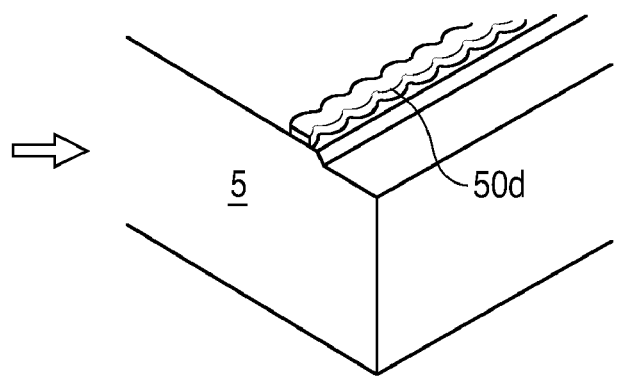
FIG. 10  FIG. 11
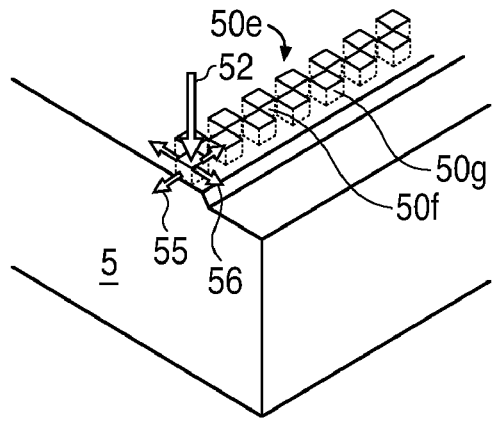 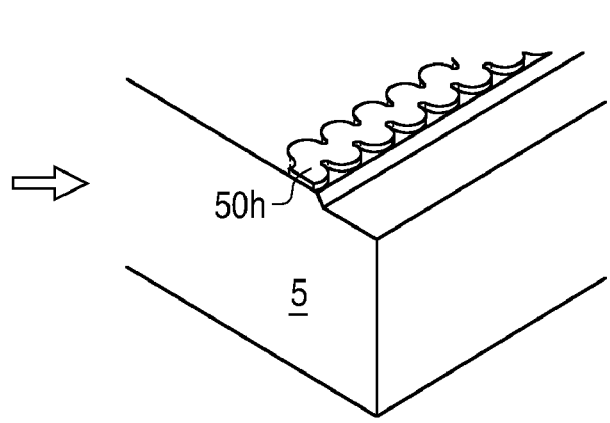
FIG. 12  FIG. 13

METHOD OF BONDING A SEMICONDUCTOR DEVICE USING A COMPLIANT BONDING STRUCTURE

FIELD OF INVENTION

The invention relates to the field of bonding semiconductor devices to other structures, and more specifically to compliant bonding structures for mounting semiconductor light emitting devices on other structures.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

US Patent Application 2007-0096130 describes "a process for forming an LED structure using a laser lift-off process to remove the growth substrate (e.g., sapphire) after the LED die is bonded to a submount. To obviate the need to use an underfill between the submount and the LED die to support the die, the underside of the LED die has formed on it anode and cathode electrodes that are substantially in the same plane, where the electrodes cover at least 85% of the back surface of the LED structure. The submount has a corresponding layout of anode and cathode electrodes substantially in the same plane.

"The LED die electrodes and submount electrodes are interconnected together such that virtually the entire surface of the LED die is supported by the electrodes and submount. No underfill is used. Different methods for LED to submount interconnection can be used, such as ultrasonic or thermosonic metal-to-metal interdiffusion (Gold-Gold, Copper-Copper, other ductile metals, or a combination of the above), or soldering with different alloy compositions such as Gold-Tin, Gold-Germanium, Tin-Silver, Tin-Lead, or other similar alloy systems.

"The growth substrate, forming the top of the LED structure, is then removed from the LED layers using a laser lift-off process, which ablates the material at the interface of the growth substrate and the LED layers. The extremely high pressures created during the laser lift-off process do not damage the LED layers due to the large area support of the LED layers by the electrodes and submount. Other substrate removal processes can also be used.

SUMMARY

An object of the invention is to provide an electrical, mechanical, and thermal connection between a semiconductor device and a structure on which the semiconductor device is mounted.

In accordance with embodiments of the invention, a compliant bonding structure is disposed between a semiconductor device and a mount. When the semiconductor device is attached to the mount, the compliant bonding structure collapses in the solid phase to partially fill a space between the semiconductor device and the mount. In some embodiments, the compliant bonding structure is plurality of metal bumps that undergo plastic deformation during bonding.

BRIEF DESCRIPTION OF THE DRAWINGS

FIG. 8 illustrates a continuous, linear edge seal.

FIG. 9 illustrates the edge seal of FIG. 8 after undergoing plastic deformation during bonding.

FIG. 10 illustrates a continuous non-linear edge seal.

FIG. 11 illustrates the edge seal of FIG. 10 after undergoing plastic deformation during bonding.

FIG. 12 illustrates a non-continuous edge seal.

FIG. 13 illustrates the edge seal of FIG. 12 after undergoing plastic deformation during bonding.

DETAILED DESCRIPTION

In devices with large-area metal contacts, as described above in US Patent Application 2007-0096130, large bonding pressure and ultrasonic power may be necessary during bonding, to overcome slight variations in the topography of the LED die electrodes and the submount electrodes. Aggressive bonding conditions can cause damage to the semiconductor material in the LED during bonding. Aggressive bonding conditions may be necessitated by the lack of compliance (i.e. deformation and collapse) in the electrodes during bonding, due to the large area of the electrodes.

In some embodiments of the invention, a compliant bonding structure is disposed between an LED die and a mount. The compliant bonding structure may be disposed on the LED die, on the mount, or on both the LED die and the mount. During bonding, the compliant structure collapses and reflows, resulting in a robust electrical, thermal, and mechanical connection that may not require aggressive bonding conditions and that may compensate for slight variations in the topography of the LED die and the mount.

FIGS. 1-4 illustrate how to form a compliant bonding structure according to embodiments of the invention.

Figure 1:
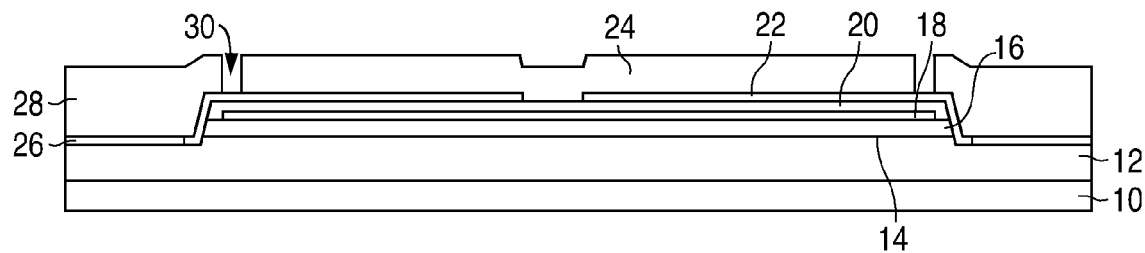
FIG. 1 is a cross section of a III-nitride device grown on a substrate.

FIG. 1 illustrates a III-nitride device grown on a substrate 10. Substrate 10 may be any suitable growth substrate, including, for example, sapphire, SiC, GaN, or engineered substrates such as SiC attached to an insulator, or III-nitride materials attached to an insulator. Engineered substrates suitable for growth of III-nitride devices are described in more detail in US Published Application 2007-0072324, which is incorporated herein by reference.

An n-type region 12 is grown first over substrate 10. N-type region 12 may include multiple layers of different compositions and dopant concentration including, for example, preparation layers such as buffer layers or nucleation layers, which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light.

A light emitting or active region 14 is grown over n-type region 12. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less. In some embodiments, the thickness of each of the light emitting layers in the device is thicker than 50 Å.

A p-type region 16 is grown over light emitting region 14. Like the n-type region, the p-type region may include multiple layers of different composition, thickness, and dopant concentration, including layers that are not intentionally doped, or n-type layers.

In some embodiments, substrate 10 is about 90 microns thick, and the device layers 12, 14, and 16 have a combined thickness less than 5 microns.

After growth of semiconductor regions 12, 14, and 16, one or more portions of p-type region 16 and light emitting region 14 are etched away to reveal portions of n-type region 12. An n-contact 26 is formed on the exposed portions of n-type region 12.

A multi-layer p-contact is formed over p-type region 16. In the example shown in FIG. 1, an ohmic contact layer 18 is formed in direct contact with p-type region 16, then a guard layer 20, which may be metal or dielectric, is formed over ohmic contact layer 18. As illustrated in FIG. 1, guard layer 20 may extend over the sides of ohmic contact layer 18. For example, ohmic contact layer 18 may include silver, which is subject to electromigration which can cause shorting or reliability problems. Guard layer 20, formed over ohmic contact layer 18, may prevent or reduce electromigration of ohmic contact layer 18. In some embodiments, more p-contact layers may be used, or guard layer 20 may be omitted.

A dielectric layer 22 may isolate n-contact 26 from the p-contact 18, 20.

A p-bond pad 24 is formed over and electrically connected to the p-contact. An n-bond pad 28 is formed over and electrically connected to the n-contact. Bond pads 24 and 28 support the device layers 12, 14, and 16 during removal of growth substrate 10, and conduct heat away from the device layers. Bond pads 24 and 28 may be formed from any metal with high thermal conductivity, such as, for example, gold, copper, or aluminum. Bond pads may be, for example, electroplated to a thickness between 6 and 30 microns in some embodiments, between 15 and 25 microns in some embodiments. Air gaps 30 may electrically isolate n- and p-bond pads 28 and 24, as illustrated in FIG. 1. The gaps are preferably less than 50 microns wide. As described above, bond pads 24 and 28 provide heat transfer and support the semiconductor layers during removal of growth substrate 10. In devices that do not require the heat transfer provided by bond pads 24 and 28 and that do not require support of the semiconductor layers (i.e., in devices where the growth substrate is not removed from the device), bond pads 24 and 28 may be omitted, and microbumps 32 may be formed directly on the p- and n-contacts.

N- and p-bond pads 28 and 24 cover at least 60% of the area of the LED (i.e., the area of semiconductor material on the LED) in some embodiments, at least 85% of the area of the LED in some embodiments.

Details of steps that may be conventional or well known in the art of forming III-N LEDs do not need to be described, and there may be many ways of forming the same structure shown in the figures. Such details that may be conventional or well known include cleaning, deposition techniques (e.g., sputtering, CVD, electro-plating, etc.), lithographic techniques, masking techniques, etching techniques, metal lift-off techniques, photoresist stripping techniques, and separating dice from a wafer.

Figure 2:
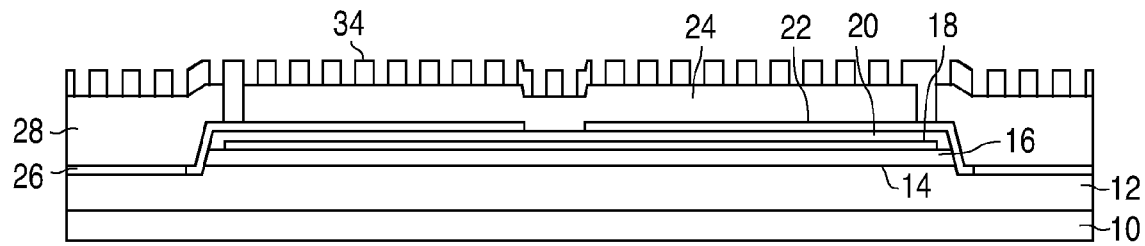
FIG. 2 is a cross section of the device of FIG. 1 after depositing and patterning a photoresist layer.

In FIG. 2, a photoresist layer 34 is formed over the top of p-bond pad 24 and n-bond pad 28, then patterned to form a series of small openings.

Figure 3:
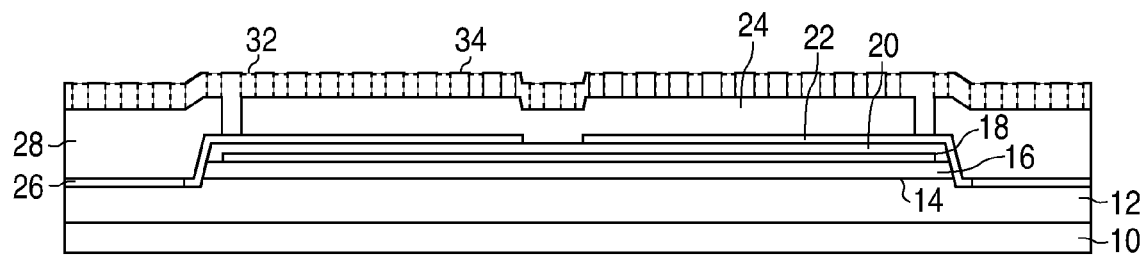
FIG. 3 is a cross section of the device of FIG. 2 after depositing metal in the openings in the photoresist layer.

In FIG. 3, a compliant metal 32 is electroplated in the openings in photoresist layer 34. Any suitable metal, for example with a Young's modulus less than 150 GPa, may be used. Examples of suitable metals include gold, with a Young's modulus of about 78 GPa, copper, with a Young's modulus between about 110 and 128 GPa, and aluminum, with a Young's modulus of about 70 GPa.

Figure 4:
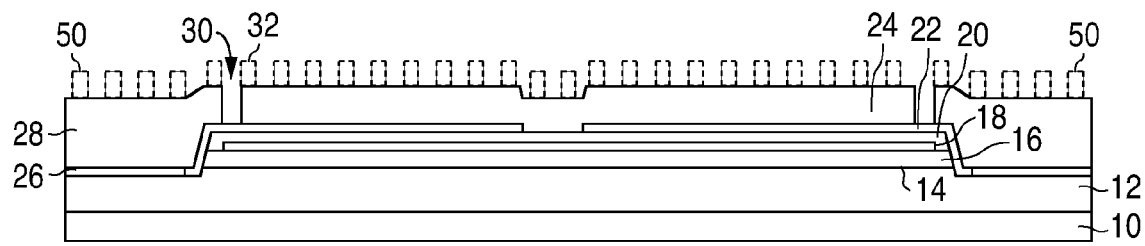
FIG. 4 is a cross section of the device of FIG. 3 after stripping the photoresist layer.

In FIG. 4, the photoresist layer 34 is stripped, leaving compliant metal microbumps 32. Microbumps 32 may be, for example, between 6 and 25 microns in lateral extent. They may have a circular cross section, though any cross section that can be patterned in photoresist layer 34 may be used. Microbumps may be between 6 and 25 microns tall, and spaced between 6 and 25 microns apart. Microbumps may have approximately the same height and width. In some embodiments, the size, height, and spacing of microbumps 32 are determined by the thickness of photoresist layer 34. The spaces in photoresist layer 34 in which microbumps 32 are plated can be made about as wide and spaced about as far apart as the photoresist layer is thick. For example, if a 10 micron thick photoresist layer is used, the smallest microbumps patterned may be about 10 microns wide and spaced about 10 microns apart. In some embodiments, the size, height, and spacing of microbumps 32 are unrelated to the thickness of photoresist layer 34. The microbumps can be made thicker than photoresist layer 34, though mushroom heads will form above the photoresist layer. The size and spacing of microbumps 32 are selected such that when the LED die is attached to a mount, the microbumps deform such most or all of the area between the LED die and the mount is filled with microbump material, leaving very small or no gaps between the LED die and the mount. For example, after attaching the LED die to a mount, in an area where the microbumps are formed (for example, the area of n- and p-bond pads in some embodiments) the space between the LED die and the mount is at least 50% filled with deformed microbumps in some embodiments, at least 75% filled with deformed microbumps in some embodiments, and at least 85% filled with deformed microbumps in some embodiments. The gaps between adjacent microbumps after bonding may be less than 2 microns in some embodiments, and less than 1 micron in some embodiments. The height of microbumps after bonding may be less than 50% the original height in some embodiments, less than 20% the original height in some embodiments, and less than 10% of the original height in some embodiments.

After the processing illustrated in FIG. 4, a wafer of devices may be diced.

Figure 5:
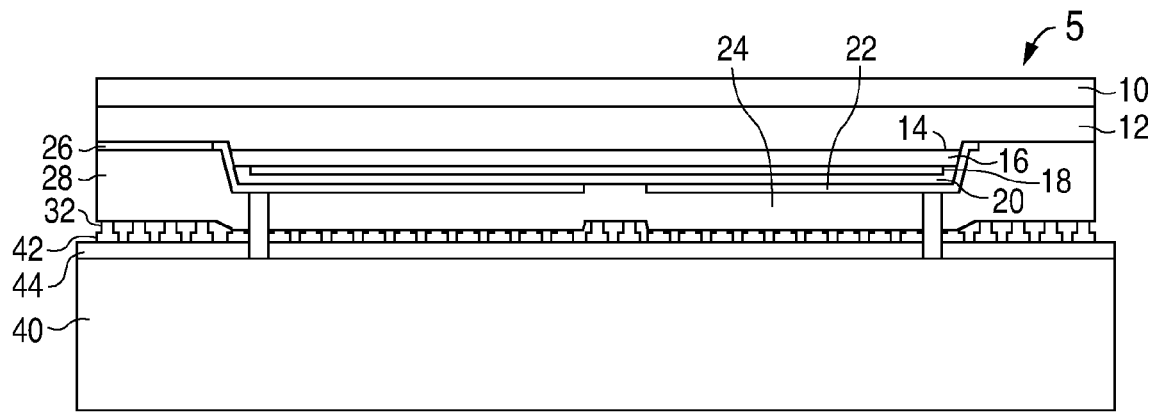
FIG. 5 is a cross section of the structure of FIG. 4 connected to a mount.

In FIG. 5, the device illustrated in FIG. 4 is flipped and mounted on a mount 40. Microbumps 42 may be formed on mount 40 to align with microbumps 32 formed on LED die 5. Microbumps may be formed on only one of LED die 5 and mount 40, or on both. LED die 5 is connected to mount 40 by applying pressure between LED die 5 and mount 40. Pressure may be accompanied by ultrasonic energy, heat, or both. The addition of one or both of ultrasonic energy and heat may reduce the pressure necessary to form a bond. Microbumps 42 formed on the mount and/or microbumps 32 formed on the LED die undergo plastic deformation (i.e., they do not return to their original shape) during bonding and form a continuous or nearly continuous metal support between the LED die and mount 40. For example, in some embodiments, after bonding, microbumps fill nearly all the space between the LED die and mount 40 corresponding to an area of n- and p-bond pads 28 and 24.

During ultrasonic bonding, LED die 5 is positioned on mount 40. A bond head is positioned on the top surface of LED die 5, often the top surface of sapphire growth substrate 10 in the case of a III-nitride device grown on sapphire. The bond head is connected to an ultrasonic transducer. The ultrasonic transducer may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and LED die 5 to vibrate, often at an amplitude on the order of microns. The vibration causes atoms in the metal lattice of microbumps 32 and 42 to interdiffuse, resulting in a metallurgically continuous joint. Heat and/or pressure may be added during bonding. During ultrasonic bonding, compliant bonding structures such as microbumps 32 and 42 collapse and reflow.

In some embodiments, the characteristics or arrangement of microbumps located at different parts of the device may have different properties. For example, microbumps may be larger and/or spaced more closely together in areas of the device that need more support during substrate removal. For example, in the areas near where the mesas are etched to expose the n-type region, the remaining p-type material may be thinned slightly, due to the mesa etch. In these areas, microbumps may be larger and/or more closely spaced, to provide more support to the thinner semiconductor material.

Microbumps 32 may be formed by other techniques, such as, for example, using a photoresist mask and a metal lift-off method, or by mechanically patterning a deposited or plated large-area, thick bonding pad. Mechanical patterning techniques include, for example, stamping, laser machining, chemical or dry etching, or mechanical roughening. In some embodiments, multiple, stacked layers of microbumps which are offset from each other may be used. Multiple layers of microbumps may result in bonding compliance in both lateral and vertical directions.

Figure 6:
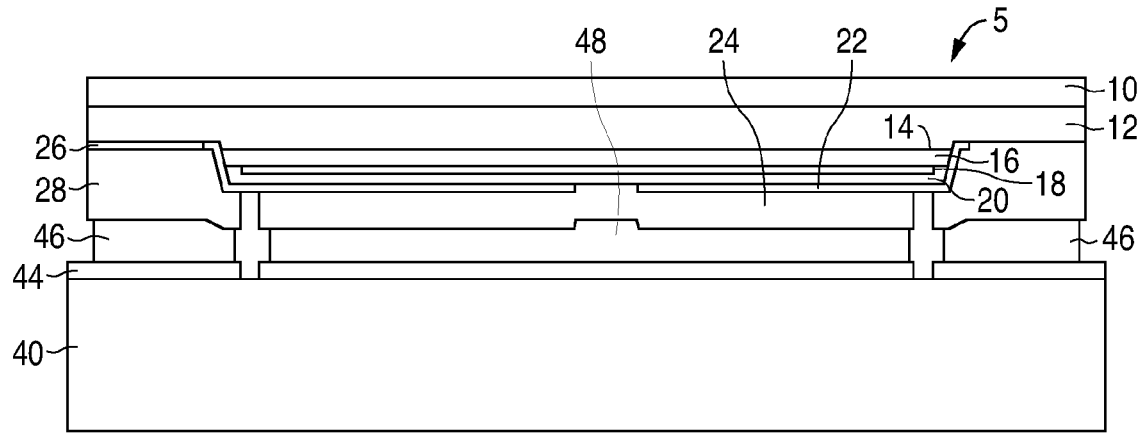
FIG. 6 is a cross section of a III-nitride device connected to a mount.

In some embodiments, microbumps 32 and 42 are replaced with a different compliant, electrically, and thermally conductive structure. FIG. 6 illustrates an example of an alternate embodiment. Instead of microbumps, a porous metal structure 46 is disposed between LED die 5 and mount 40. Porous metal structure 46 may be formed on bond pads 24 and 28 of LED die 5, on bond pads 44 of mount 40, or on both the LED bond pads and the mount bond pads. Porous metal structure 46 may be formed by, for example, plating a soft metal under process conditions that made the plated surface porous, rough, or dendritic in nature, or by sintering small particles of metal to make a fused porous structure. LED die 5 and mount 40 may then be bonded as described above. Porous metal structure 46 may undergo plastic deformation during bonding. Unlike solder, which becomes liquid during bonding, compliant bonding structures such as the microbumps and porous metal structures described herein generally collapse in the solid phase. Though heat may be applied during bonding which may cause the compliant bonding structure to become softer or to begin to melt, in some embodiments the compliant bonding structure does not get hot enough to become completely liquid phase.

A compliant structure such as microbumps or a porous metal structure may compensate for slight surface non-planarities between the bond pads on the LED die and the surface of the mount on which the LED die is mounted, without requiring high pressure or temperature during bonding. The ability of microbumps to deform may reduce the pressure and/or temperature required to form a bond with robust thermal, mechanical, and electrical connections, and may reduce the occurrence of cracking or other damage during bonding to the mount.

After bonding LED die 5 to mount 40, growth substrate 10 may be removed, for example by laser lift off, etching, or any other technique suitable to a particular growth substrate. After removing the growth substrate, the semiconductor structure may be thinned, for example by photoelectrochemical etching, and/or the surface may be roughened or patterned, for example with a photonic crystal structure. A lens, wavelength converting material, or other structure known in the art may be disposed over LED 5 after substrate removal.

In some embodiments, the microbumps along the edge of LED die 5 are configured to form a seal during bonding. In the device illustrated in FIG. 4, microbumps 50 on the edge of the device are configured to form a seal. The seal may provide extra mechanical support to the edge of the device and may prevent foreign material such as humidity or silicone encapsulants from entering any spaces between LED die 5 and mount 40.

Figure 7:
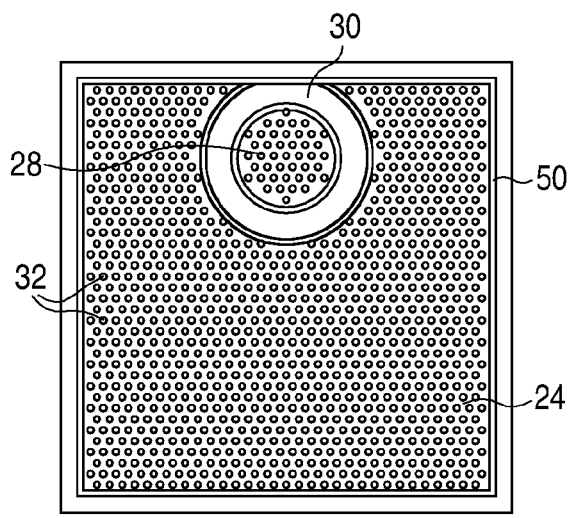
FIG. 7 is a plan view of an LED device with microbumps and an edge seal.

FIG. 7 is a plan view of a device with a first example of an edge seal. In the device illustrated in FIG. 7, a continuous, linear bump seal 50 surrounds microbumps 32. For example, an edge seal surrounds the microbumps in p-bond pad area 24 at the edge of die 5 and surrounds a gap 30 between the p-bond pad and the n-bond pad. Another seal surrounds the microbumps formed on the n-bond pad area 28. FIG. 8 illustrates a portion of a device with a linear perimeter bump seal 50*a* as illustrated in FIG. 7. Only a portion of linear bump seal 50*a* is shown, and microbumps 32 are omitted for clarity. When pressure 52 is applied to bump seal 50*a*, such as while bonding device 5 to a mount (not shown in FIG. 8), bump seal 50*a* can deform in only one direction, indicated by arrows 54. FIG. 9 illustrates the edge seal of FIG. 8 after undergoing plastic deformation during bonding. Edge seal 50*b* has spread out in the direction 54 indicated in FIG. 8.

Since the continuous linear edge seal 50*a* illustrated in FIGS. 7 and 8 can only deform in one direction, it is less compliant than microbumps 32, which can deform in more than one direction. As a result, during bonding, more force may be exerted on the portion of the LED device underlying edge seal 50*a* than is exerted on the portion of the LED device underlying microbumps 32.

In some embodiments, an edge seal 50 is configured to deform in more than one direction during bonding. In some embodiments, the shape of edge seal 50 is selected such that the compliance of edge seal 50 matches the compliance of microbumps 32.

FIG. 10 illustrates a portion of a device with an edge seal 50c that can deform in more than one direction. Edge seal 50c is a continuous, non-linear bump seal that surrounds microbumps 32. Only a portion of seal 50c is shown, and microbumps 32 are omitted for clarity. Edge seal 50c has a wavy shape. When pressure 52 is applied to bump seal 50c, such as while bonding device 5 to a mount (not shown in FIG. 10), bump seal 50c can deform in more than one direction, indicated by arrows 55 and 56. FIG. 11 illustrates the edge seal of FIG. 10 after undergoing plastic deformation during bonding. Edge seal 50d has spread out in the directions 55 and 56 indicated in FIG. 10.

FIG. 12 illustrates a portion of a device with another example of an edge seal 50e that can deform in more than one direction. Edge seal 50e is two lines 50f and 50g of offset microbumps that surround microbumps 32. Only a portion of edge seal 50e is shown, and microbumps 32 are omitted for clarity. Microbumps in lines 50f and 50g need not be in contact with each other, though they may be. When pressure 52 is applied to bump seal 50e, such as while bonding device 5 to a mount (not shown in FIG. 12), bump seal 50e can deform in more than one direction, indicated by arrows 55 and 56. FIG. 13 illustrates the edge seal of FIG. 12 after undergoing plastic deformation during bonding. The two lines 50f and 50g of microbumps in edge seal 50e have spread out in the directions 55 and 56 indicated in FIG. 12 to form a continuous seal 50h.

During ultrasonic bonding, described above, the transducer generally vibrates in a single direction. For example, the transducer may vibrate along axis 56, illustrated in FIGS. 10 and 12, and create little or no motion along axis 55. Compliant bonding structures tend to preferentially collapse along the vibration axis. Accordingly, in some embodiments, edge seal 50 is wider along axes perpendicular to the vibration axis, and narrower along axes parallel to the vibration axis.

Though the above-described examples and embodiments refer to flip clip III-nitride light emitting devices, the compliant bonding structures and edge seals described herein may be used with any suitable device, which need not be a flip chip, a III-nitride device, an LED, or even a light emitting device.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
   disposing a compliant bonding structure between a semiconductor device and a mount, wherein the compliant bonding structure comprises a plurality of metal bumps; and
   bonding the semiconductor device to the mount, wherein:
   bonding causes the compliant bonding structure to collapse such that the compliant bonding structure electrically and mechanically connects the semiconductor device to the mount;
   the compliant bonding structure remains in a solid phase during bonding; and
   bonding causes the plurality of metal bumps to deform such that most or all of the area between the semiconductor device and the mount where the plurality of metal bumps are formed is filled with material from the plurality of metal bumps, leaving no gaps between adjacent bumps or gaps less than 2 microns wide between adjacent bumps.

2. The method of claim 1 wherein a height of the compliant bonding structure after bonding is less than 50% of an original height of the compliant bonding structure.

3. The method of claim 1 wherein the semiconductor device comprises:
   a semiconductor structure comprising a light emitting region disposed between an n-type region and a p-type region;
   an n-metal structure disposed on a portion of the n-type region; and
   a p-metal structure disposed on a portion of the p-type region.

4. The method of claim 1 wherein the plurality of metal bumps comprise a metal with a Young's modulus less than 150 GPa.

5. The method of claim 1 wherein:
   the plurality of metal bumps each have a width between 6 and 25 microns and a height between 6 and 25 microns;
   nearest neighbor bumps are spaced between 6 and 25 microns apart.

6. The method of claim 1 wherein the plurality of metal bumps are gold bumps.

7. The method of claim 3 wherein:
   the n-metal structure comprises a gold layer at least ten microns thick;
   a portion of the plurality of metal bumps are formed on the n-metal structure;
   the p-metal structure comprises a gold layer at least ten microns thick; and
   a portion of the plurality of metal bumps are formed on the p-metal structure.

8. The method of claim 1 wherein in a first region of the semiconductor structure, nearest neighbor bumps are more closely spaced than nearest neighbor bumps in a second region of the semiconductor structure.

9. The method of claim 3 wherein after bonding the collapsed metal bumps have a height less than 20% of a height of at least one of the plurality of metal bumps.

10. The method of claim 3 wherein the semiconductor light emitting device further comprises a growth substrate, the method further comprising removing the growth substrate after bonding.

11. The method of claim 3 wherein a portion of the compliant bonding structure proximate to an edge of the semiconductor light emitting device is configured such that during bonding, the portion of the compliant bonding structure collapses to form a seal between the semiconductor light emitting device and the mount.

12. The method of claim 11 wherein the portion of the compliant bonding structure proximate to an edge of the semiconductor light emitting device comprises a continuous, linear metal bump.

13. The method of claim 11 wherein the portion of the compliant bonding structure proximate to an edge of the semiconductor light emitting device comprises a continuous, curved metal bump.

14. The method of claim 11 wherein the portion of the compliant bonding structure proximate to an edge of the semiconductor light emitting device comprises at least two lines of metal bumps, wherein the at least two lines of metal bumps are offset such that during bonding, the at least two lines of metal bumps collapse to form a continuous seal.

15. The method of claim 1 wherein after bonding, a space between the semiconductor device and the mount is at least 85% filled with deformed metal bumps.

* * * * *